(12) United States Patent
Li et al.

(10) Patent No.: US 9,153,546 B2
(45) Date of Patent: Oct. 6, 2015

(54) RELIABLE ELECTRICAL FUSE WITH LOCALIZED PROGRAMMING AND METHOD OF MAKING THE SAME

(71) Applicant: International Business Machines Corporation, Armonk, NY (US)

(72) Inventors: Yan Zun Li, Lagrangeville, NY (US); Zhengwen Li, Scarsdale, NY (US); Chengwen Pei, Danbury, CT (US); Jian Yu, Danbury, CT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 14/454,041

(22) Filed: Aug. 7, 2014

(65) Prior Publication Data

US 2014/0370671 A1    Dec. 18, 2014

Related U.S. Application Data

(62) Division of application No. 13/095,164, filed on Apr. 27, 2011, now Pat. No. 8,896,088.

(51) Int. Cl.
| | |
|---|---|
| *H01L 21/332* | (2006.01) |
| *H01L 23/52* | (2006.01) |
| *H01L 23/62* | (2006.01) |
| *H01L 21/84* | (2006.01) |
| *H01L 23/525* | (2006.01) |
| *H01L 27/12* | (2006.01) |
| *G11C 17/16* | (2006.01) |
| *H01L 21/02* | (2006.01) |
| *H01L 21/285* | (2006.01) |

(Continued)

(52) U.S. Cl.
CPC ............. *H01L 23/62* (2013.01); *G11C 17/16* (2013.01); *H01L 21/02532* (2013.01); *H01L 21/28518* (2013.01); *H01L 21/76886* (2013.01); *H01L 21/823814* (2013.01); *H01L 21/84* (2013.01); *H01L 23/5256* (2013.01); *H01L 27/1203* (2013.01); *H01L 2924/0002* (2013.01)

(58) Field of Classification Search
USPC ......... 438/136, 137, 156, 173, 192, 206, 212, 438/424, 427, 428, 591; 257/20, 194, 257/135–136, 213–413, 900, 902–903
See application file for complete search history.

(56) References Cited

U.S. PATENT DOCUMENTS

| | | |
|---|---|---|
| 7,485,944 B2 | 2/2009 | Kothandaraman et al. |
| 2007/0082431 A1 | 4/2007 | Hoefler et al. |

(Continued)

OTHER PUBLICATIONS

U.S. Appl. No. 13/095,164, filed Apr. 27, 2011.

*Primary Examiner* — Selim Ahmed
*Assistant Examiner* — Moin Rahman
(74) *Attorney, Agent, or Firm* — Yuanmin Cai; Hoffman Warnick LLC (57) ABSTRACT

An electrical fuse has an anode contact on a surface of a semiconductor substrate. The electrical fuse has a cathode contact on the surface of the semiconductor substrate spaced from the anode contact. The electrical fuse has a link within the substrate electrically interconnecting the anode contact and the cathode contact. The link comprises a semiconductor layer and a silicide layer. The silicide layer extends beyond the anode contact. An opposite end of the silicide layer extends beyond the cathode contact. A silicon germanium region is embedded in the semiconductor layer under the silicide layer, between the anode contact and the cathode contact.

6 Claims, 11 Drawing Sheets

(51) Int. Cl.
*H01L 21/768* (2006.01)
*H01L 21/8238* (2006.01)

(56) References Cited

U.S. PATENT DOCUMENTS

| | | | |
|---|---|---|---|
| 2007/0190697 A1* | 8/2007 | Kothandaraman et al. ... | 438/132 |
| 2007/0222028 A1 | 9/2007 | Matsuoka et al. | |
| 2008/0067629 A1 | 3/2008 | Miyashita | |
| 2008/0169529 A1 | 7/2008 | Kim et al. | |
| 2008/0186788 A1* | 8/2008 | Barth ... | 365/225.7 |
| 2009/0128225 A1* | 5/2009 | Moy et al. ... | 327/525 |
| 2010/0181643 A1 | 7/2010 | Kothandaraman et al. | |

* cited by examiner

RELIABLE ELECTRICAL FUSE WITH LOCALIZED PROGRAMMING AND METHOD OF MAKING THE SAME

FIELD OF THE INVENTION

The present invention relates generally to integrated circuits, and more specifically to electrical fuse ("eFUSE").

BACKGROUND

Electrically programmable fuse (eFUSE) is commonly used in integrated circuits including CMOS integrated circuits for a variety of reasons. For example, eFUSE is used to form permanent connections in an integrated circuit after the integrated circuit is manufactured. eFUSE is also used in circuit repairs, i.e., to interconnect a redundant circuit when the primary circuit fails in order to improve product yield. eFUSE can also be used as permanent memory to store information on chips such as chip ID or critical system boot codes. Additionally, eFUSE can be used to adjust the speed of a circuit by adjusting the resistance of a current path formed by the eFUSE.

Figure 1A:
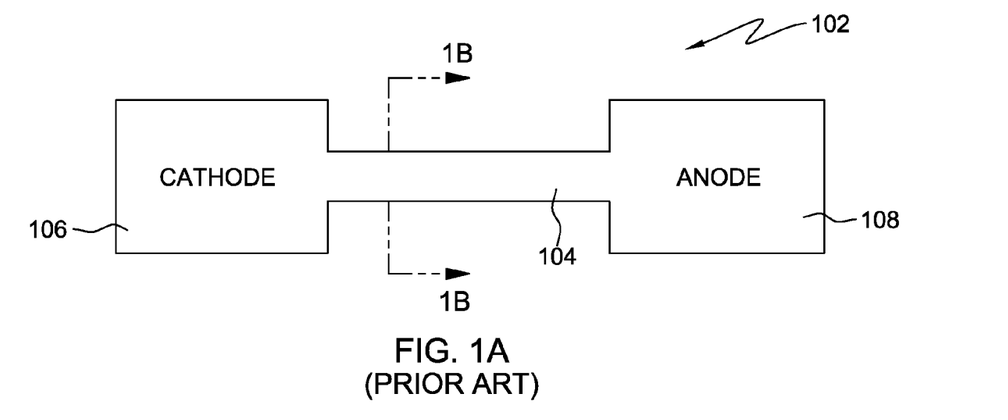
FIG. 1A illustrates a top view of an eFUSE according to the Prior Art.
Figure 1B:
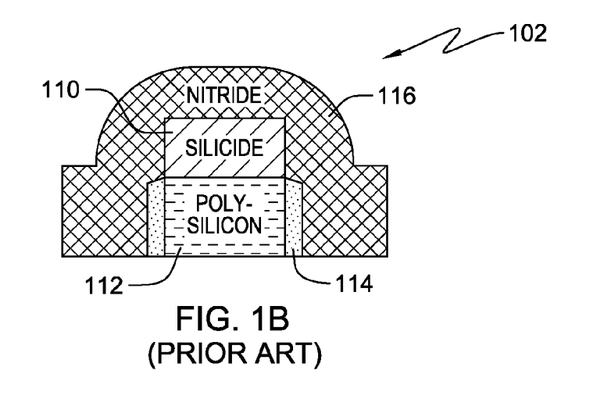
FIG. 1B illustrates a cross-sectional view of an eFUSE according to the Prior Art, taken along the plane 1B-1B of FIG. 1A.
Figure 1C:
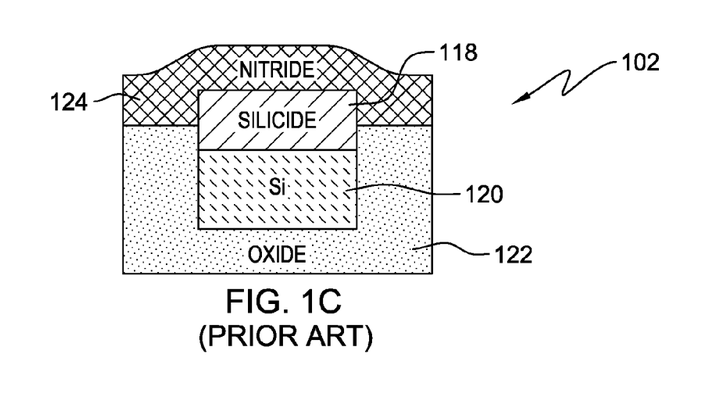
FIG. 1C illustrates another top view of an eFUSE according to the Prior Art.

FIG. 1A illustrates a top view of a known eFUSE 102. FIG. 1B illustrates a cross sectional view of eFUSE 102 of FIG. 1A. eFUSE 102 has a cathode contact region 106, an anode contact region 108, and a fuse link 104. Fuse link 104 interconnects cathode contact region 106 to anode contact region 108. The fuse link 104 of eFUSE 102 has an underlying poly-silicon layer 112 and an overlying silicide layer 110. eFUSE 102 also has an oxide layer 114 separating poly-silicon layer 112 from nitride layer 116. Alternatively, as illustrated in FIG. 1C, eFUSE 102 may have an underlying oxide layer 122 and overlying silicide layer 118, separated by a silicon layer 120. A nitride layer 124 overlays silicide layer 118.

eFUSE 102 is programmed by electromigration of silicide in fuse link 104 from cathode contact region 106 to anode contact region 108, as follows. A voltage potential is applied across fuse link 104 via anode contact region 108 and cathode contact region 106, such that the resultant current has a magnitude and direction to initiate electromigration of silicide from the cathode contact region side of the semiconductor fuse link 104 and to create a gap in silicide, thereby reducing the conductivity of the fuse link 104.

The programming of an eFUSE is sensitive to process and power supply variations. Process variations change the fuse character, such as overall resistance and sub-components resistances, and thus lead to change of the optimal programming current. Power supplies used for fuse programming may also experience variations, such as power droop, on a given product implementation, i.e. the potential variation at fuse to be programmed due to parasitic wiring resistance and leakage current in the circuits. As a result, a fuse may be programmed with either too little current or too much current which leads to undesirable outcomes. For example, the programming yield may suffer from either end. In addition, the programmed fuse may heal in subsequent manufacturing process such as test and packaging, or worse in the field which results in a failing product in service.

Figure 2:
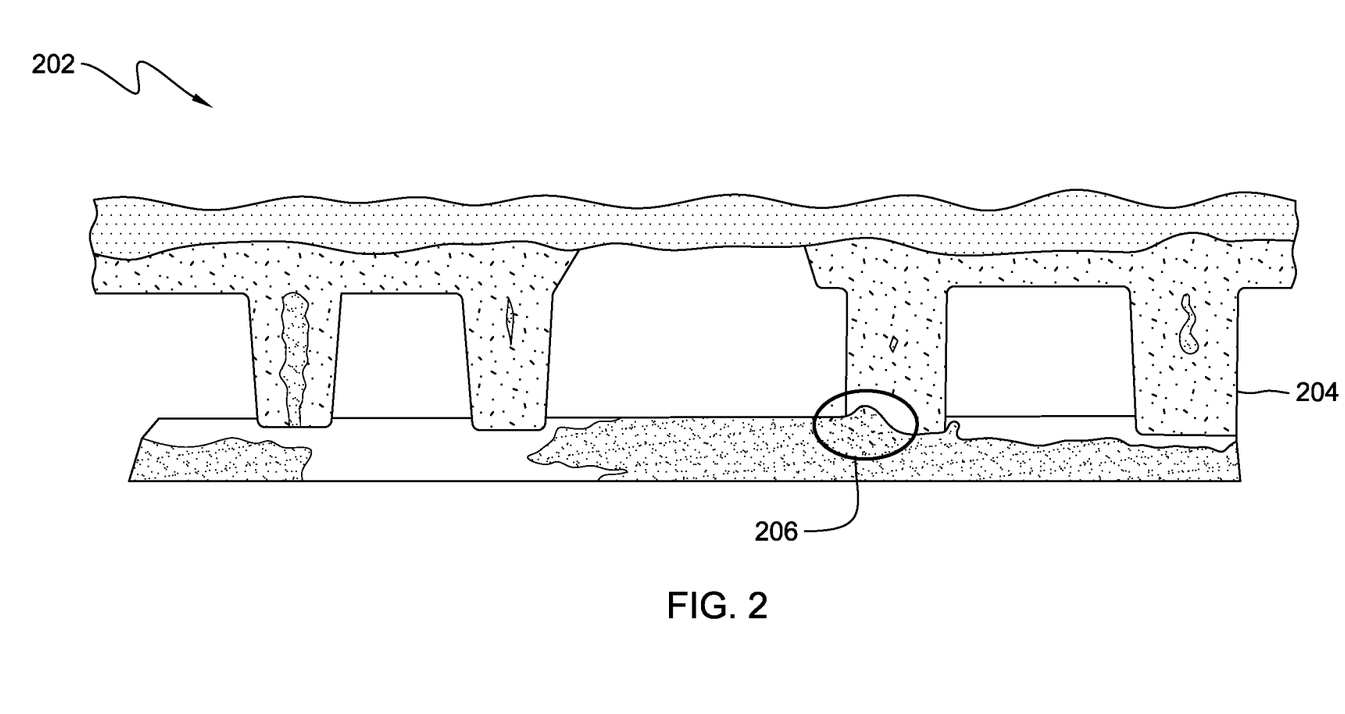
FIG. 2 illustrates an example of a failed eFUSE according to the Prior Art.
Figure 3A:
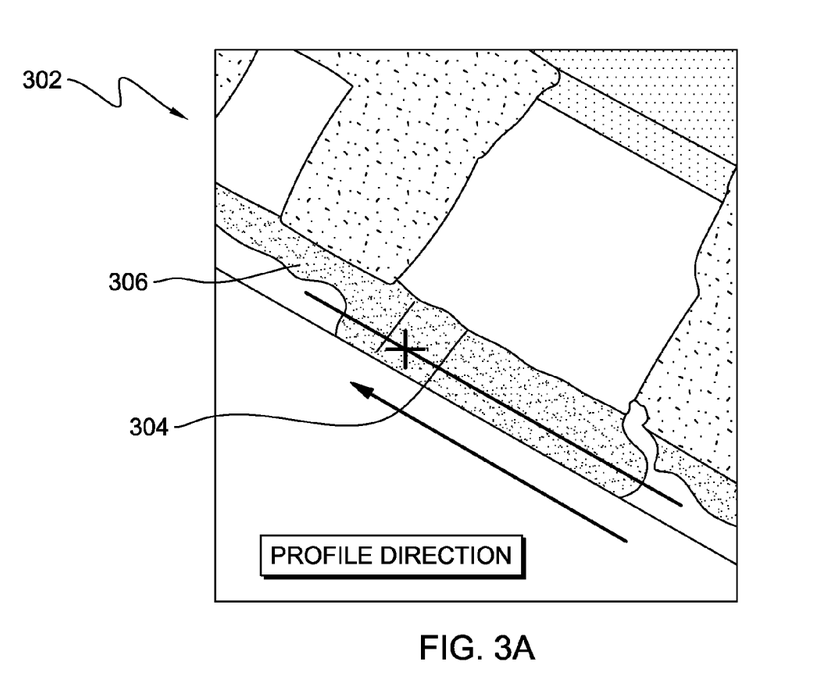
FIG. 3A illustrates another example of a failed eFUSE according to the Prior Art which had been subjected to a thermal stress after being programmed.
Figure 3B:
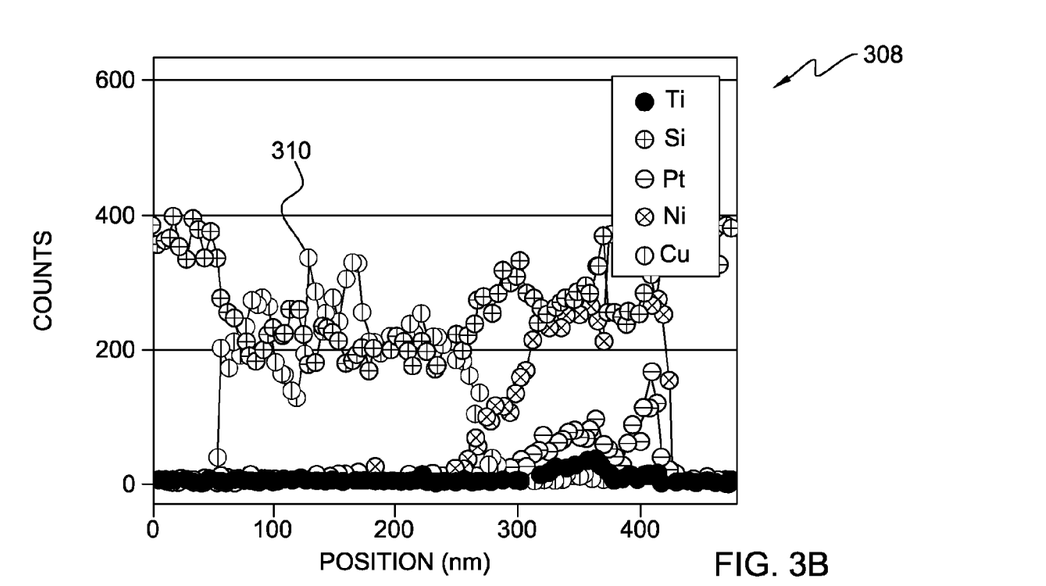
FIG. 3B is a graph illustrating an elemental analysis of the failed eFUSE of FIG. 3A.

FIG. 2 illustrates an example eFUSE 202 after the eFUSE 202 has been programmed with too much current. eFUSE 202 has experienced damage 206 at cathode contact 204 resulting from over programming that partially migrated the cathode contact material, e.g., the contact liner material and contact itself. As a result, copper metal wire above the contact can be exposed and readily diffuse into the programmed fuse link when the fused part is subjected to elevated temperature, such as those during the subsequent manufacturing process. For example, a packaging process subjects eFUSE 102 to heat as high as 360° C. This renders the eFUSE back to its original pre-programmed state. FIG. 3A illustrates an example of a failed eFUSE 302 resulting from copper diffusing from the cathode contact 304 into fuse link 306. FIG. 3B is an elemental analysis 308 of the failed eFUSE of FIG. 3A showing the concentration of copper 310 in the programmed fuse link 306 that electrically reconnects the cathode and anode contacts indicating a pre-programmed state.

Figure 4A:
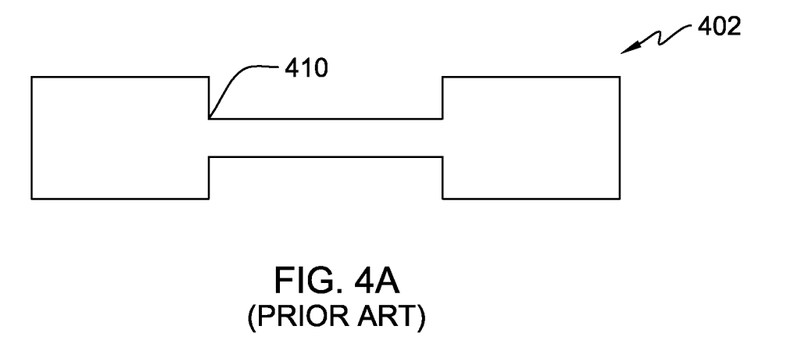
FIG. 4A illustrates a top view of an eFUSE according to the Prior Art.
Figure 4B:
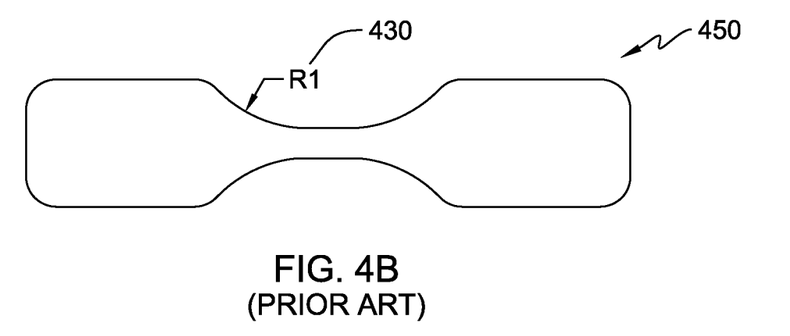
FIG. 4B illustrates a top view of an eFUSE with corner rounding according to the Prior Art.

In addition, the lithography used to manufacture the known eFUSE 102 is imprecise. FIG. 4A illustrates eFUSE design 402 having a right angle corner 410. Physically implementing the design, however, results in rounded corners 430 as illustrated by eFUSE 450 in FIG. 4B. Furthermore, corner rounding is highly variable. Several factors contribute to variations in corner rounding including tool focus, dosage, optical proximity correction (OPC), light wavelength, photoresist, etc. Thus, corner rounding contributes to fuse variability in terms of optimal programming condition and programming yield.

An object of the present invention is to improve the safety window for fuse programming through heat conduction engineering so that programming occurs at desired location, the center region of fuse link, away from the susceptible cathode contact. Another object of the present invention is to design an eFUSE to tolerate higher programming current. Another object of the present invention is to minimize the sensitivities of fuse programming to process variations such as corner rounding effect.

SUMMARY

In a first embodiment of the present invention, an electrical fuse has an anode contact on a surface of a semiconductor substrate. The electrical fuse has a cathode contact on the surface of the semiconductor substrate spaced from the anode contact. The electrical fuse has a link within the substrate electrically interconnecting the anode contact and the cathode contact. The link comprises a semiconductor layer and a silicide layer. The silicide layer extends beyond the anode contact. An opposite end of the silicide layer extends beyond the cathode contact. A silicon germanium region is embedded in the semiconductor layer under the silicide layer, between the anode contact and the cathode contact.

In a second embodiment of the present invention, an electrical fuse is made by dividing a silicon substrate into a first region, a second region adjacent to the first region, and a third region adjacent to the second region, using shallow trench isolation. A first recess is created in the first region and a second recess is created in the second region, using reactive ion etching. Silicon Germanium is grown in the first and second recess. The nitride layer is removed. A silicide region is formed in the first region, above the Silicon Germanium grown in the first recess. An anode contact and a cathode contact are formed in the first region adjoining the silicide.

In a third embodiment of the present invention, an electrical fuse is programmed by causing electrons in silicide within a fuse link of the fuse to electromigrate towards an anode contact of the fuse, away from a cathode contact. A voltage potential is applied across the fuse link, from a cathode contact of the fuse to the anode contact. The voltage potential provides a current of 3-10 mA.

DETAILED DESCRIPTION

A reliable electrical fuse is provided which offers low programming current, improved programming yield, and reduced programming damage. The benefits are realized through the engineering of local heat conduction, local electrical current density, and power distribution from the material selection and design of the fuse structure. Embodiments herein provide the fuse structure design and material selection and the method of making and programming the fuse.

Figure 5A:
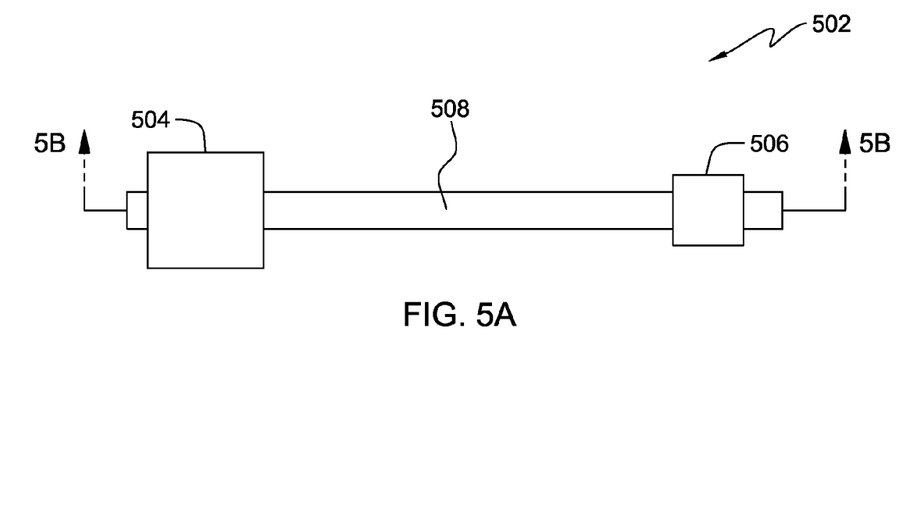
FIG. 5A illustrates a top view of an eFUSE according to one embodiment of the present invention.
Figure 5B:
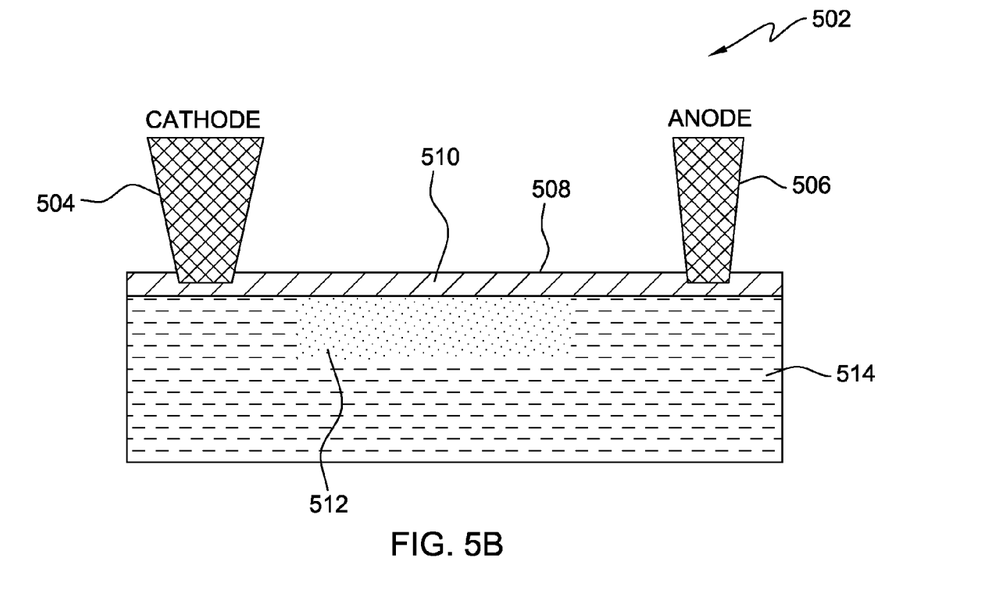
FIG. 5B illustrates a cross-sectional view of the eFUSE of FIG. 5A taken along the plane 5B-5B of FIG. 5A.

The present invention will now be described in detail with reference to the figures. FIG. 5A illustrates a top view of an eFUSE 502 according to one embodiment of the present invention. FIG. 5B illustrates a cross-sectional view of the eFUSE 502 of FIG. 5A taken along the plane 5B-5B of FIG. 5A, according to one embodiment of the present invention. The eFUSE 502 has a semiconductor layer 514 and a silicide layer 510. In one example, semiconductor layer 514 is a poly-silicon layer. In another example, semiconductor layer 514 is a crystalline silicon layer. In another example (not shown) semiconductor layer 514 is a silicon-on-insulator (SOI) layer. It should be understood that, although semiconductor layer 514 will be described as silicon hereafter in the description, semiconductor layer 514 can also be other semiconductor materials such as III-V or II-VI semiconductors. In addition, semiconductor layer 514 can be n-type doped or p-type doped or un-doped. In the example embodiment, silicide layer 510 is formed with nickel silicide although it should be understood that other similar metal silicides may be used to form silicide layer 510.

The eFUSE 502 has an anode contact 506 and a cathode contact 504. Anode contact 506 and cathode contact 504 are electrically interconnected by the silicide in fuse link 508. Silicide layer 510 in fuse link 508 extends outwards, underneath and beyond anode contact 506 and underneath and beyond cathode contact 504. Cathode contact 504 is larger than anode contact 506. Both cathode contact 504 and anode contact 506 are optimally sized to prevent cathode damage during programming. For example, anode contact 506 may be 50-100 nm wide and cathode contact 504 may be 100-150 nm wide on a 40-60 nm wide fuse link 508 of eFUSE 502. A large cathode contact 504 lowers the current density as well as lowers the resistance of the contact and thus provides some protection for eFUSE 502 from being damaged during programming A small anode contact 506 increases the overall fuse resistance and thus helps reduce the required current for programming eFUSE 502.

The eFUSE 502 includes a silicon germanium (SiGe) region 512 embedded within semiconductor layer 514 under fuse link 508. SiGe region 512 is positioned under silicide region 510, in between cathode contact 504 and anode contact 506. SiGe region 512 has a much lower thermal conductivity, i.e., ~0.1 vs 1.5 (W/cm.° C.) of that of silicon and therefore keeps heat concentrated at fuse link 508 such that programming occurs at this desired location away from cathode contact 504. Thus, SiGe region 512 protects cathode contact 504 from being damaged during programming and therefore helps improve reliability of eFUSE 502.

The generally linear shape of eFUSE 502, which is narrower and has much smaller area under the anode and cathode contacts 506 and 504 and less total mass than the Prior Art eFUSE. Thus, during programming, less heat is absorbed by cathode contact 504 and anode contact 506, away from fuse link 508, as compared to the Prior Art eFUSE. Because less heat is absorbed away from the fuse link 508 and more heat is trapped in the desired location for programming above SiGe of the present invention, less current is required to program eFUSE 502. Support circuitry for delivering large current is more costly, more complex to implement, and requires more silicon space as compared to circuitry for delivering the smaller current of the present invention. Thus, linear shaped eFUSE 502 is more optimized and cost effective as compared to the Prior Art eFUSE with or without corner rounding.

The eFUSE 502 can also be manufactured more precisely than the known design eFUSE illustrated in FIGS. 1A and 4A. Linear eFUSE 502 according to one embodiment of the present invention does not have any corners and is therefore not subject to the same variability as is known to Prior Art eFUSE.

eFUSE 502 is programmed by applying a voltage potential across fuse link 508, from cathode contact 504 to anode contact 506. A low programming current is used in applying the voltage potential. For a typical example, the programming current is 3-5 mA. The current (voltage potential) is applied for a short period of time. For example, the current is maintained for 1-10 micro-seconds. This results in silicide electromigrating away from silicide region 510 in fuse link 508, towards anode contact 506. This creates a gap in silicide region 510 such that the resistance of eFUSE 502 is changed to very high.

Figure 6A:
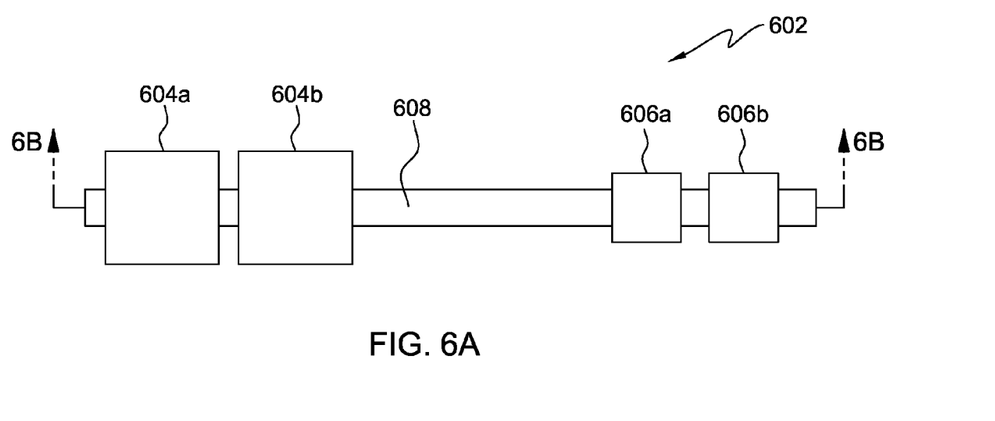
FIG. 6A illustrates a top view of an eFUSE according to another embodiment of the present invention.
Figure 6B:
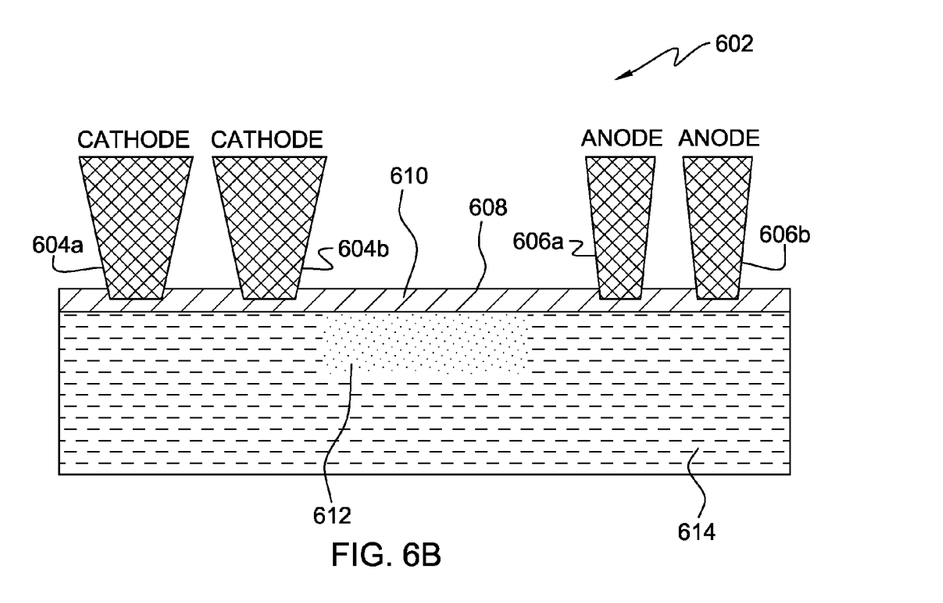
FIG. 6B illustrates a cross-sectional view of the eFUSE of FIG. 6A taken along the plan 6B-6B of FIG. 6A.

FIG. 6A illustrates a top view of an eFUSE 602 according to another embodiment of the present invention. FIG. 6B illustrates a cross-sectional view of eFUSE 602 taken along the plane 6B-6B of FIG. 6A, according to another embodiment of the present invention. The eFUSE 602 has a semiconductor layer 614 and a silicide layer 610. The eFUSE 602 includes a silicon germanium (SiGe) region 612 embedded within semiconductor layer 614 of fuse link 608 to promote fuse programming at this location as described in the embodiment of FIGS. 5A and 5B. SiGe region 612 is positioned under silicide region 610, in between cathode contacts 604a and 604b and anode contacts 606a and 606b.

The eFUSE 602 has two cathode contacts 604a and 604b and two anode contacts 606a and 606b. Fuse link 608 electrically interconnects anode contacts 606a and 606b and cathode contacts 604a and 604b. Silicide layer 610 of fuse link 608 extends outwards, beyond anode contacts 606a and 606b and beyond cathode contacts 604a and 604b. Cathode contacts 604a and 604b are larger than anode contacts 606a and 606b. Cathode contacts 604a and 604b and anode contacts 606a and 606b are optimally sized to help prevent cathode damage during programming. For example, anode contact 606 may be 50-100 nm wide and cathode contact 604 may be 100-150 nm wide on a 40-60 nm wide fuse link 608 of eFUSE 602. In another example, anode contact 606 may be 50% wider than the fuse link 608 and cathode contact 604 may be 150% wider than fuse link 608.

Having two cathode contacts 604a and 604b and two anode contacts 606a and 606b significantly reduces defectivity level from the redundant contacts and thus improves the programming yield. In addition, the presence of second anode contact 606b and second cathode contacts 604b helps alleviate strain on first anode contact 606a and first cathode contact 604a by reducing electrical current density and temperature at first anode contact 606a and first cathode contact 604a and therefore, helps prevent programming damages that may become reliability hazards.

As a result of the added protection measures for over-programming damage to the eFUSE described in FIGS. 5A-5B and 6A-6B, programming can be conducted at slightly higher current level, and thus also improves the programming yield resulting from otherwise too little current. In other words, the sensitivity of fuse programming to process variations is reduced.

Figure 7A:
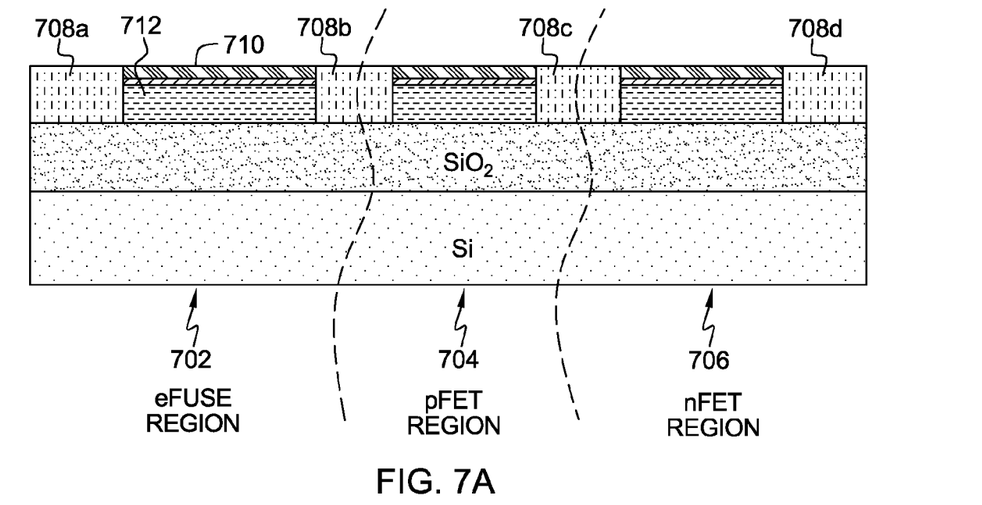
FIG. 7A illustrates a stage in the manufacture of the eFUSEs of FIGS. 6A and 6B, according to one embodiment of the present invention.

FIGS. 7A-7F illustrate the stages in manufacture of the eFUSE of FIGS. 6A and 6B, according to one embodiment of the present invention. In FIG. 7A, shallow trench isolation (STI) defines three silicon regions, eFUSE region 702, pFET region 704, and nFET region 706 by dividing a nitride layer 710 on a silicon substrate 712. Shallow trenches 708a-d are created using reactive ion etching. Trenches 708a-d are then filled with dielectric filing to form STI.

Figure 7B:
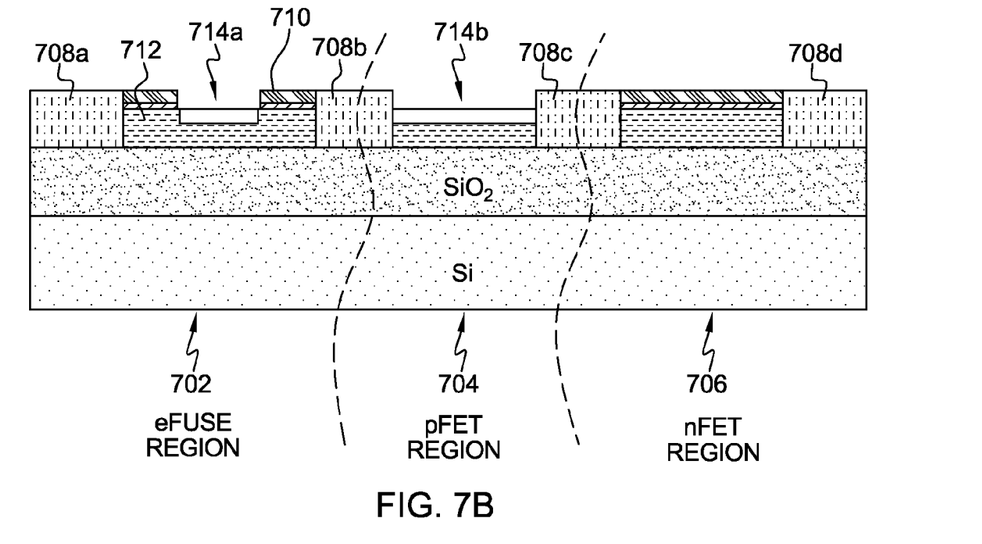
FIG. 7B illustrates a subsequent stage in the manufacture of the eFUSEs of FIGS. 6A and 6B, according to one embodiment of the present invention.

In FIG. 7B, Silicon Germanium (SiGe) regions 714a-b are defined in eFUSE region 702 and in pFET region 704 by creating recesses in silicon substrate 712 using reactive ion etching.

Figure 7C:
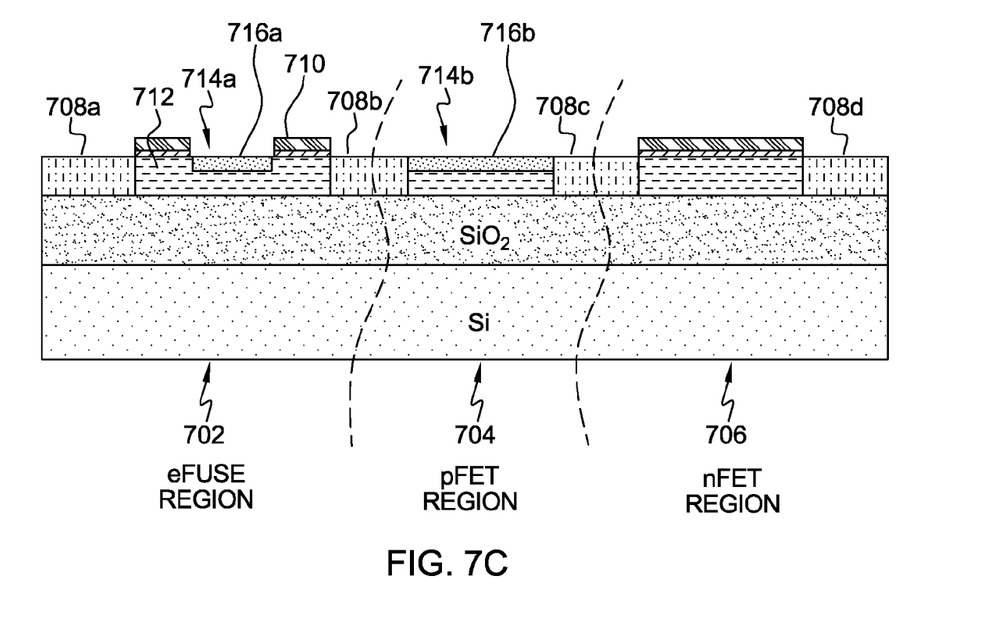
FIG. 7C illustrates a subsequent stage in the manufacture of the eFUSEs of FIGS. 6A and 6B, according to one embodiment of the present invention.

In FIG. 7C, SiGe 716a is grown in SiGe regions 714a of eFUSE region 702 simultaneously as SiGe 716b is grown in SiGe region 714b of pFET region 704 in a standard CMOS technology, and is therefore cost free. SiGe is epitaxially grown and un-doped. The Ge content can vary from a few percentage points to ~40-50%. The SiGe is used in PFET region for performance gain due to the improved hole mobility from the compressive stress.

Figure 7D:
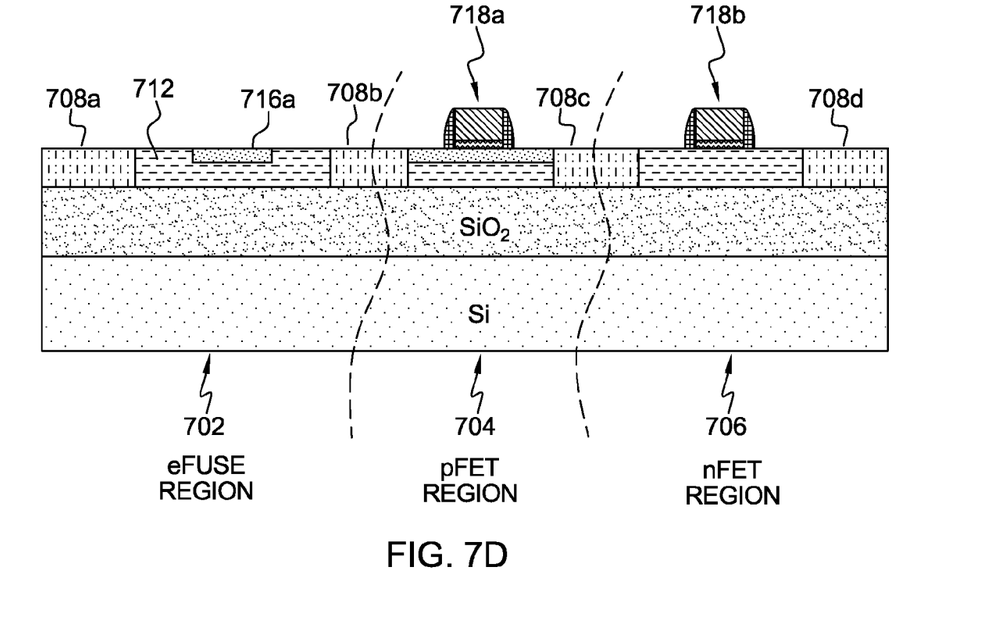
FIG. 7D illustrates a subsequent stage in the manufacture of the eFUSEs of FIGS. 6A and 6B, according to one embodiment of the present invention.

In FIG. 7D, nitride layer 710 is removed. CMOS pFET 718a in pFET region 704 and CMOS nFET 718b in nFET region 706 are then completed according to standard CMOS manufacturing flows.

Figure 7E:
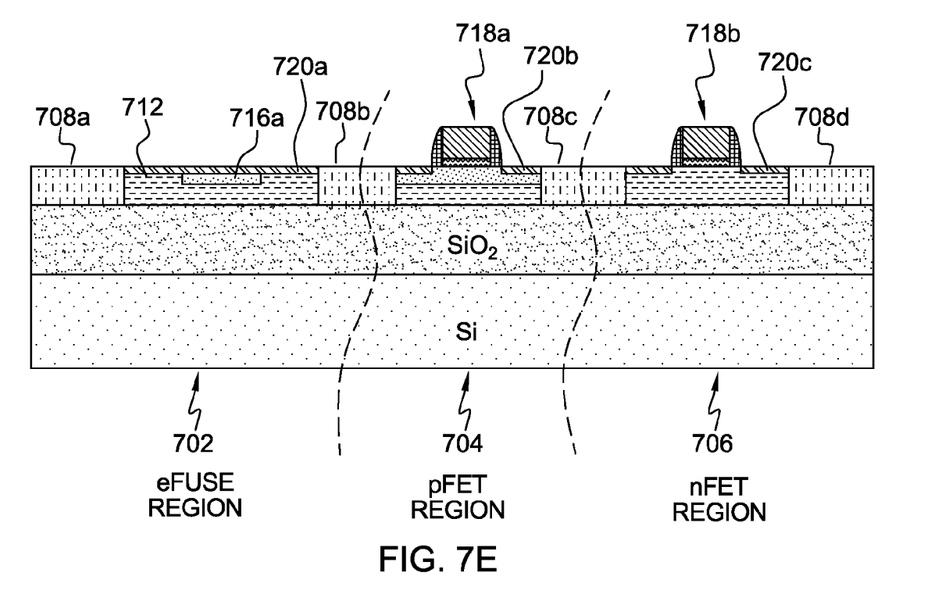
FIG. 7E illustrates a subsequent stage in the manufacture of the eFUSEs of FIGS. 6A and 6B, according to one embodiment of the present invention.

In FIG. 7E, silicide 720a is formed in eFUSE region 702, above SiGe 716a. Simultaneously, silicide 720b-c is formed at CMOS FET 718a of pFET region 704 and at CMOS FET 718b of nFET region 706.

Figure 7F:
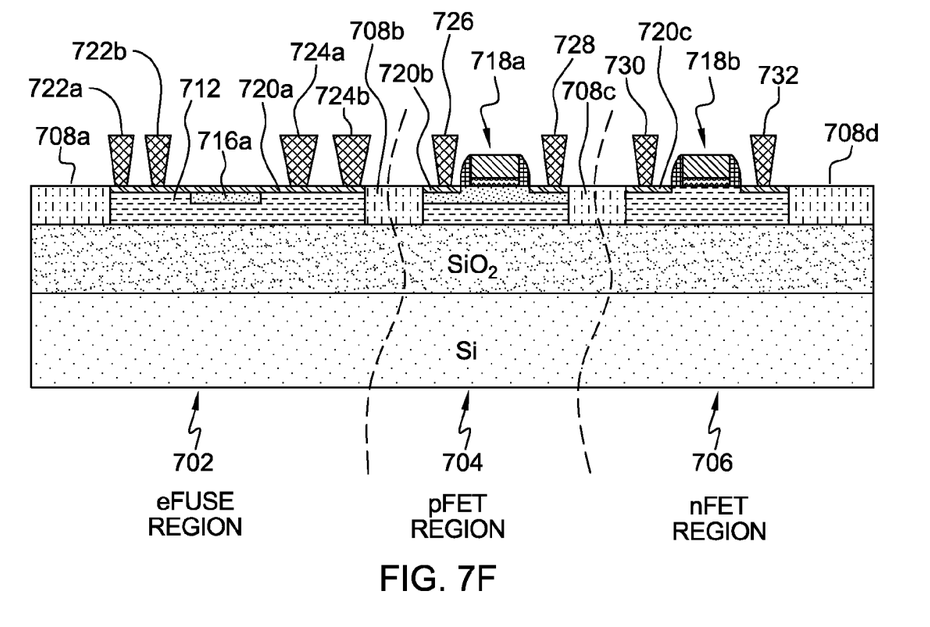
FIG. 7F illustrates a subsequent stage in the manufacture of the eFUSEs of FIGS. 6A and 6B, according to one embodiment of the present invention.

In FIG. 7F, standard middle-of-the-line (MOL) process forms anode and cathode contacts in eFUSE region 702, pFET region 704, and nFET region 706. Anode contacts 722a-b and cathode contacts 724a-b are formed in eFUSE region 702, at silicide 720a. Source and drain contacts 726 and 728 are likewise formed in pFET region 704, at silicide 720b, and source and drain contacts 730 and 732 are likewise formed in nFET region 706, at silicide 720c.

Figure 8:
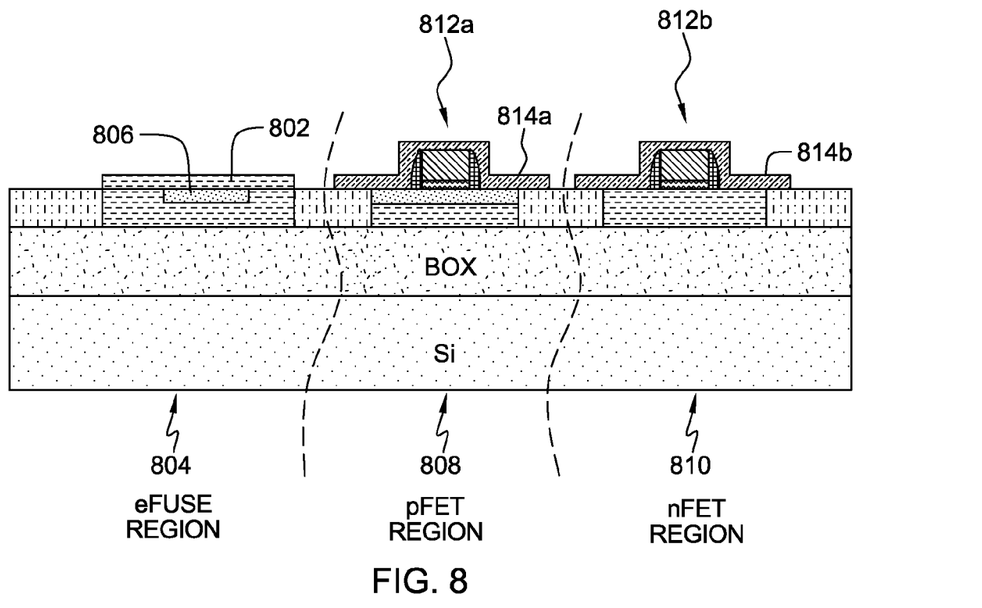
FIG. 8 illustrates an EPI silicon growth stage after the stage in FIG. 7D in the manufacture of the eFUSEs of FIGS. 6A and 6B, according to another embodiment of the present invention.
Figure 9:
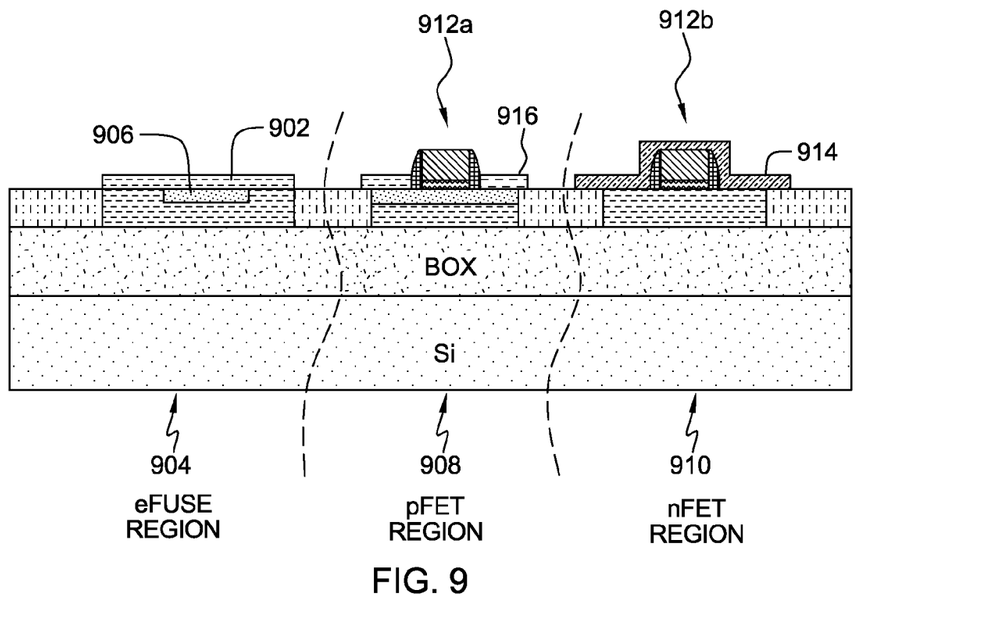
FIG. 9 illustrates an EPI silicon growth stage after the stage in FIG. 7D in the manufacture of the eFUSEs of FIGS. 6A and 6B, according to another embodiment of the present invention.
Figure 10:
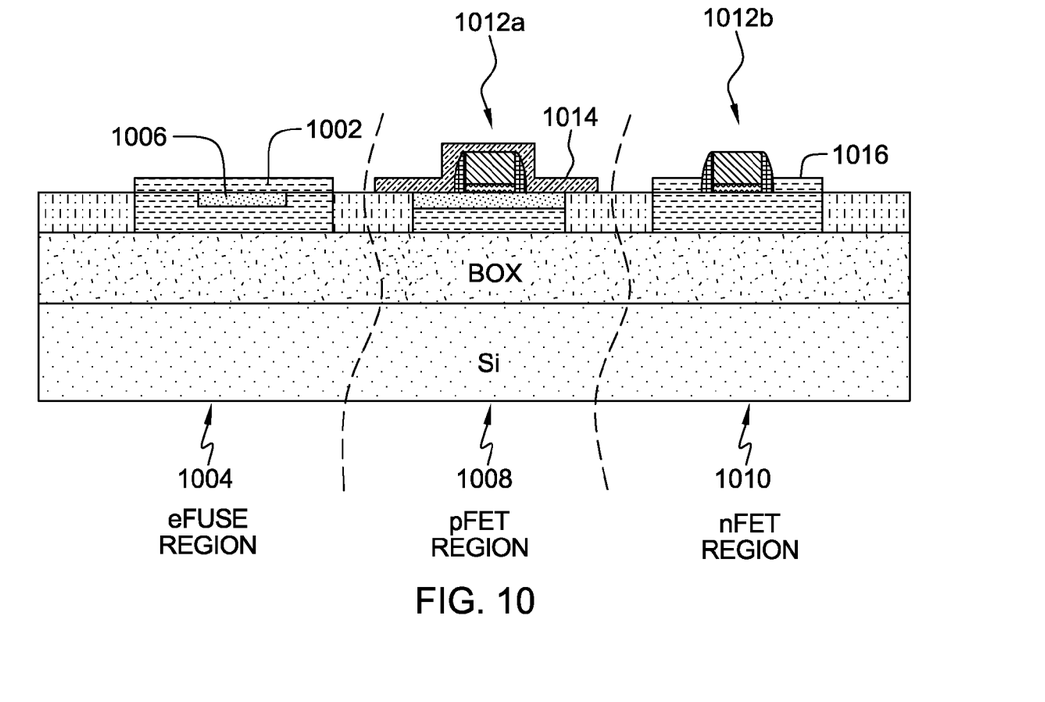
FIG. 10 illustrates an EPI silicon growth stage after the stage in FIG. 7D in the manufacture of the eFUSEs of FIGS. 6A and 6B, according to another embodiment of the present invention.

FIGS. 8-10 illustrate an epi silicon growth stage, following the step of FIG. 7D, in the manufacture of the eFUSE of FIGS. 6A and 6B, according to other embodiments of the present invention. Silicide can then be formed on silicon instead of the SiGe as in the embodiment in FIG. 7E. Forming silicide directly on SiGe may result in higher defect density. Including a layer of silicon between the silicide and the SiGe helps reduce the defect density.

In FIG. 8, un-doped silicon 802 is formed in eFUSE region 804, above silicon region and SiGe 806 by epitaxial growth. Nitride 814a and nitride 814b block CMOS FET 812a of pFET region 808 and CMOS FET 812b of nFET region 810 from growing this silicon layer.

In FIG. 9, p+ doped silicon 902 is formed in eFUSE region 904, above silicon region and SiGe 906 from the same epi process to grow the raised source/drain 916 at CMOS OFT 912a of pFET region 908. Nitride 914 blocks CMOS nFET 912b of nFET region 910 from growing the p+ doped silicon.

In FIG. 10, n+ doped silicon 1002 is formed in eFUSE region 1004, above silicon region and SiGe 1006 from the same epi process to grow the raised source/drain 1016 at CMOS nFET 1012b of nFET region 1010. Nitride 1014 blocks CMOS pFET 1012a of pFET region 1008 from growing the n+ doped silicon.

The description above has been presented for illustration purposes only. It is not intended to be an exhaustive description of the possible embodiments. One of ordinary skill in the art will understand that other combinations and embodiments are possible.

What is claimed is:

1. A method for making an electrical fuse, the method comprising the steps of:
  dividing a silicon substrate into a first region, a second region adjacent to the first region, and a third region adjacent to the second region, using shallow trench isolation;
  creating a first recess in the first region and a second recess in the second region, using reactive ion etching;
  growing silicon germanium in the first recess and the second recess;
  forming silicide in the first region, above the silicon germanium grown in the first recess; and forming an anode contact and a cathode contact in the first region adjoining the silicide.

2. The method of claim 1, further comprising the steps of:
constructing a PMOS field effect transistor in a p-type field effect transistor region;
and constructing an NMOS field effect transistor in an n-type field effect transistor region; wherein the first region is an electrical fuse region;
wherein the second region is the p-type field effect transistor region;
and wherein the third region is the n-type field effect transistor region.

3. The method of claim 2, further comprising the step of forming a layer of un-doped silicon in the first region, above the silicon germanium.

4. The method of claim 2, further comprising the steps of:
forming a layer of p+ doped silicon in the first region, above the silicon germanium; and
forming a raised silicon source and drain at the PMOS field effect transistor in the p-type field effect transistor region.

5. The method of claim 2, further comprising the steps of:
forming a layer of n+ doped silicon in the first region, above the silicon germanium; and
forming a raised silicon source and drain at the NMOS field effect transistor in the n-type field effect transistor region.

6. The method of claim 1, wherein the silicon germanium is grown epitaxially.

* * * * *